(12) United States Patent
Takano et al.

(10) Patent No.: US 11,695,338 B2
(45) Date of Patent: Jul. 4, 2023

(54) SEMICONDUCTOR INTEGRATED CIRCUIT FOR A REGULATOR FOR FORMING A LOW CURRENT CONSUMPTION TYPE DC POWER SUPPLY DEVICE

(71) Applicants: Yoichi Takano, Hadano (JP); Chuhei Terada, Isehara (JP)

(72) Inventors: Yoichi Takano, Hadano (JP); Chuhei Terada, Isehara (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 69 days.

(21) Appl. No.: 17/400,246

(22) Filed: Aug. 12, 2021

(65) Prior Publication Data

US 2022/0069706 A1 Mar. 3, 2022

(30) Foreign Application Priority Data

Aug. 25, 2020 (JP) ................... 2020-141574

(51) Int. Cl.
| | |
|---|---|
| *G05F 1/575* | (2006.01) |
| *H02M 7/53* | (2006.01) |
| *H02M 3/158* | (2006.01) |
| *G05F 1/46* | (2006.01) |
| *H03K 17/16* | (2006.01) |

(52) U.S. Cl.
CPC .......... *H02M 3/158* (2013.01); *G05F 1/575* (2013.01); *H02M 7/53* (2013.01); *H03K 17/167* (2013.01)

(58) Field of Classification Search
CPC ......... G05F 1/575; G05F 1/46; H03K 17/167; H02M 7/53
See application file for complete search history.

(56) References Cited

U.S. PATENT DOCUMENTS

| | | |
|---|---|---|
| 8,847,569 B2 | 9/2014 | Terada et al. |
| 9,606,556 B2 | 3/2017 | Takano et al. |
| 9,996,093 B2 | 6/2018 | Takano et al. |

(Continued)

FOREIGN PATENT DOCUMENTS

| | | |
|---|---|---|
| CN | 104102261 B | 11/2015 |
| CN | 103529890 B | 8/2016 |

(Continued)

OTHER PUBLICATIONS

Extended European Search Report (EESR) dated Jan. 21, 2022, issued in counterpart European Application No. 21191067.4.

*Primary Examiner* — Sisay G Tiku
(74) *Attorney, Agent, or Firm* — Holtz, Holtz & Volek PC

(57) ABSTRACT

Disclosed is a semiconductor integrated circuit for a regulator for forming a low current consumption type DC power supply device. The semiconductor integrated circuit includes an output transistor, a control circuit, an operation control transistor and a soft start circuit. The output transistor is connected between an output terminal and a voltage input terminal to which a DC voltage is input. The control circuit controls the output transistor according to a feedback voltage of an output. The operation control transistor controls an operation state of the control circuit. The soft start circuit gradually changes a voltage applied to a control terminal of the operation control transistor and delays activation of the control circuit at a time of applying a power supply voltage to the voltage input terminal.

5 Claims, 4 Drawing Sheets

(56) References Cited

U.S. PATENT DOCUMENTS

| | | | | |
|---|---|---|---|---|
| 2012/0098508 | A1* | 4/2012 | Zhu | G05F 1/56 323/272 |
| 2015/0137781 | A1 | 5/2015 | Qu et al. | |
| 2019/0393773 | A1* | 12/2019 | Terada | H03K 17/284 |
| 2022/0147086 | A1* | 5/2022 | Lee | G05F 1/468 |
| 2022/0271747 | A1* | 8/2022 | Takano | H03K 17/223 |

FOREIGN PATENT DOCUMENTS

| | | | | |
|---|---|---|---|---|
| CN | 106959720 A | | 7/2017 | |
| CN | 114460991 A | * | 5/2022 | G05F 1/575 |
| JP | H05313762 A | | 11/1993 | |

\* cited by examiner

SEMICONDUCTOR INTEGRATED CIRCUIT FOR A REGULATOR FOR FORMING A LOW CURRENT CONSUMPTION TYPE DC POWER SUPPLY DEVICE

CROSS-REFERENCE TO RELATED APPLICATION

This application is based upon and claims the benefit of priority from the prior Japanese Patent Application No. 2020-141574, filed on Aug. 25, 2020, the entire contents of which are incorporated herein by reference.

BACKGROUND

Technical Field

The present invention relates to a technique which is used and effective in a semiconductor integrated circuit (regulator IC) for forming a voltage regulator such as a series regulator that is a DC power supply device and that furthermore converts a DC voltage, for example.

Background Art

There is a series regulator (hereinafter, simply referred to as a regulator) as a power supply device that controls a transistor provided between a DC voltage input terminal and an output terminal and outputs a DC voltage of a desired electric potential. As a usage of such a regulator, for example, there is a system that converts the voltage of a battery BT with a regulator REG and supplies a DC voltage Vout to a microcomputer MCU in a battery-powered mobile device, as shown in FIG. 1.

The mobile device has a standby mode in which the microcomputer is in a low power consumption state. In the standby mode, only the minimum function such as a time counting operation by a timer operates. In such a system, an LDO (Low Drop Out regulator) of the low current consumption type (several µA or less) is also used in the regulator, and the design is made to lengthen the battery life. The CE terminal (on/off function) is provided to the IC forming the regulator REG, and the CE terminal is connected to the VDD terminal when the microcomputer is in continuous operation.

In the system shown in FIG. 1, when the battery is inserted or exchanged, there flows an electric current called rush current that charges the output capacitor of the low current consumption type LDO to a defined value. Thus, the overshoot may occur in the output voltage. When such overshoot exceeds a rated value of the subsequent device (microcomputer in FIG. 1), the device is possibly broken, which needs to be addressed with a measure. There has been conventionally an invention described in JP H05-313762 A as the invention that suppresses the overshoot of the regulator.

The regulator described in JP H05-313762 A includes a differentiating circuit for differentiating the signal from the power on/off circuit (two-stage inverter) connected to the on/off terminal, and turns on the MOS transistor for current source forming an error amplifier with the signal generated at the differentiating circuit at the moment of power-on. Thus, the electric current flowing in the error amplifier is temporarily increased to improve the response property, and thereby the overshoot of the regulator at the time of power-on is suppressed.

However, in the overshoot suppressing circuit (two-stage inverter and differentiating circuit) described in JP H05-313762 A, there is a problem that the overshoot cannot be suppressed sufficiently depending on conditions, such as a case where the power supply voltage rises relatively slowly at the time of inserting the battery, for example.

SUMMARY

The invention has been made focusing on the above problems, and an object of the present invention is to provide a regulator IC that can suppress the overshoot of the output voltage when the power is turned on.

Another object of the present invention is to provide a regulator IC that can suppress the overshoot of the output voltage when the power is turned on without largely increasing the cost.

According to an aspect of the present invention, there is provided a semiconductor integrated circuit for a regulator for forming a low current consumption type DC power supply device, the semiconductor integrated circuit including: an output transistor that is connected between an output terminal and a voltage input terminal to which a DC voltage is input; a control circuit that controls the output transistor according to a feedback voltage of an output; an operation control transistor that controls an operation state of the control circuit; and a soft start circuit that gradually changes a voltage applied to a control terminal of the operation control transistor and delays activation of the control circuit at a time of applying a power supply voltage to the voltage input terminal.

BRIEF DESCRIPTION OF THE DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, a preferred embodiment of the present invention will be described with reference to the drawings.

Figure 2:
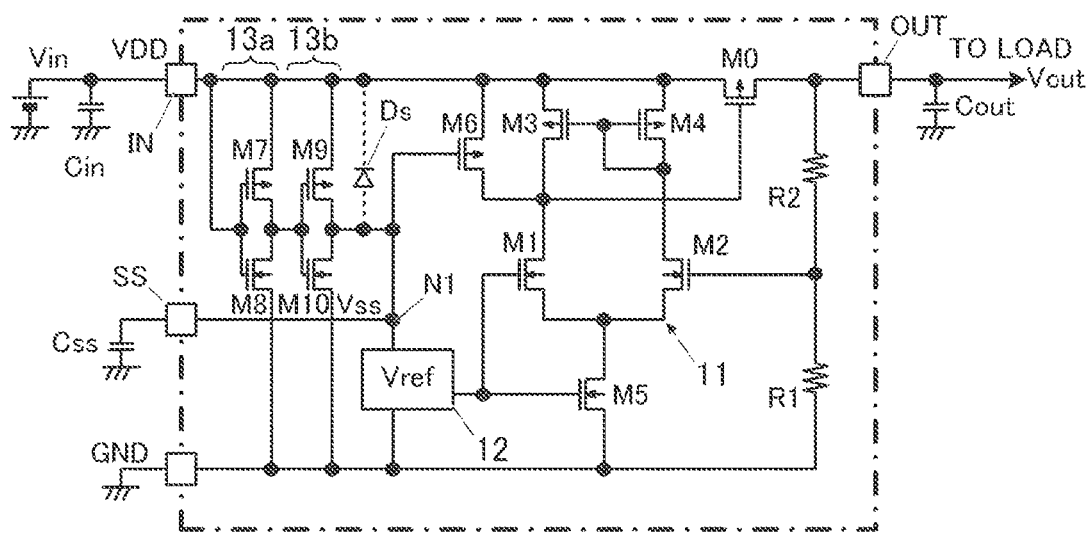
FIG. 2 is a circuit configuration view showing an embodiment of a regulator IC according to the present invention.

FIG. 2 shows an embodiment of a series regulator as a DC power supply device to which the present invention is applied. In FIG. 2, the portion surrounded by the dashed-dotted line is formed as a semiconductor integrated circuit (regulator IC) 10 on a semiconductor chip such as a single-crystal silicon, and has the output terminal OUT of the regulator IC 10 connected to a capacitor Cout to function as a DC power supply device (LDO) that supplies a stable DC voltage Vout.

In the regulator IC 10 in the present embodiment, as shown in FIG. 2, an output transistor M0 formed of a P-channel MOS transistor is connected between the output terminal OUT and the voltage input terminal IN to which the DC voltage VDD from a power supply Vin such as a battery is applied. Bleeder resistors R1 and R2 that divide the output voltage Vout are connected in series between the output terminal OUT and the ground line (ground point) to which the ground potential GND is applied. The output transistor M0 is formed as an element that is large in size compared to other transistors described below so as to make a large current flow toward the output terminal OUT.

The voltage divided by the bleeder resistors R1 and R2 is fed back to a non-inverting input terminal of an error amplifier (amplifying circuit) 11 as a control circuit that controls the base terminal of the output transistor M0. The error amplifier 11 controls the output transistor M0 according to the potential difference between the feedback voltage of output and a predetermined reference voltage Vref to control the output voltage Vout to be a desired electric potential.

The error amplifier 11 is formed by including a pair of input differential transistors M1, M2, a pair of active load transistors M3, M4 connected between the drain terminals of M1, M2 and the input terminal IN, and a constant current transistor M5 connected between a common emitter terminal of the input differential transistors M1, M2 and the ground point. M3 and M4 are P-channel MOS transistors, and M1, M2 and M5 are N-channel MOS transistors.

The regulator IC 10 in the present embodiment includes: a reference voltage circuit 12 for generating the reference voltage Vref applied to the inverting input terminal of the above error amplifier 11; a P-channel MOS transistor M6 for shutdown connected in parallel with the load transistor M3 of the error amplifier 11; and two-stage CMOS inverters 13a, 13b for controlling the gate terminal of the transistor M6 and supplying the power supply voltage to the reference voltage circuit 12. Instead of the CMOS inverter, there may be used a resistance load type inverter replacing the transistors M7 and M10 with respective resistance elements.

The reference voltage circuit 12 can be formed by connecting, in series, resistors, the Zener diode, and a band gap circuit for the configuration of bipolar or a CMOS reference voltage circuit (for example, depression type MOSFET+ enhancement type MOSFET) for the configuration of CMOS, for example.

In the regulator IC 10 in the embodiment, the constant of each of the elements forming the circuit is set such that the total of current consumptions of the above error amplifier 11, the reference voltage circuit 12, and the resistive voltage dividing circuit (R1, R2) is several μA (equal to or less than 10 μA). Thus, the regulator IC 10 in the embodiment can be configured as a low current consumption type LDO.

The input terminal of the inverter 13a is connected to the voltage input terminal IN, and the voltage VDD is input. The output terminal of the inverter 13b is connected to the gate terminal of the shutdown transistor M6. An external terminal SS to connect the output terminal of the inverter 13b is provided, and an external capacitor Css is connected to the external terminal SS.

The transistor M6 is an element for surely turning off the output transistor M0 at the time of power-off. When applying of the voltage VDD from the power supply (battery) to the voltage input terminal IN is stopped, the N-channel MOS transistor M10 on the low side of the inverter 13b is turned on, and the output is changed to a low level. By lowering the gate terminal of the transistor M6 to a ground potential, M6 is turned on and the voltage VDD of the voltage input terminal IN is transmitted to the gate terminal of the output transistor M0 and M0 is turned off.

Figure 1:
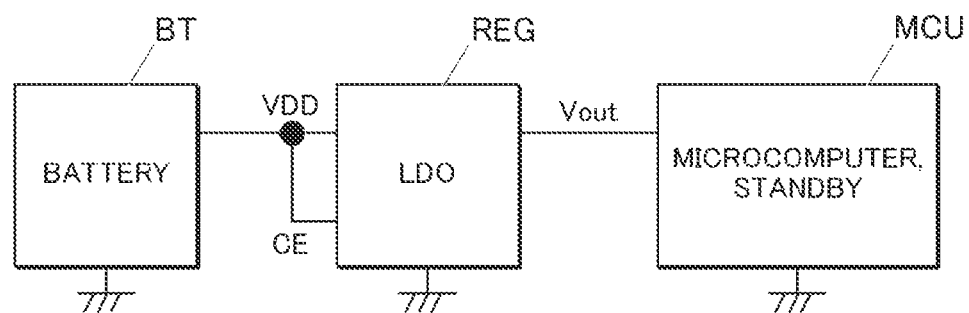
FIG. 1 is a functional block diagram showing a configuration example of a system using a low current consumption type LDO as a power supply device.

The DC power supply device having the above configuration is used as the LDO of the system shown in FIG. 1. When the voltage VDD from the battery is applied to the voltage input terminal IN by insertion of the battery, the output of the inverter 13a changes to a low level and thereby the P-channel MOS transistor M9 on a high side of the inverter 13b is turned on to charge the capacitor Css connected to the external terminal SS. When an electric potential of the node N1 rises to a threshold voltage of the transistor M6, M6 is turned off. By the error amplifier 11 being activated, the gate terminal of the output transistor M0 is driven and controlled according to the voltages from resistors R1, R2 for output voltage division.

As described above, the LDO in the present embodiment can slowly activate the error amplifier 11 by the rise in electric potential of the node N1 according to the time constant which is determined by the capacity value of the capacitor Css and the on-resistance of M9 at the time of power-on. That is, the soft start circuit of the LDO is formed by the inverters 13a, 13b, capacitor Css, and the transistor M6. By this soft start circuit, it is possible to suppress the situation that a large electric current (rush current) suddenly flows to the capacitor Cout and the overshoot occurs in the output voltage Vout when the power is turned on.

There may be provided an on/off terminal CE as well as the external terminal SS. In this case, the input terminal of the inverter 13a is connected to the on/off terminal CE. As in the circuit of the embodiment in FIG. 2, by having the configuration in which the input terminal of the inverter 13a is connected to the voltage input terminal IN, it is possible to realize the configuration of connecting the external capacitor Css without increasing the number of pins in the IC. The above change can be performed by merely changing the wiring pattern on the IC chip. Thus, it is possible to avoid the increase in cost.

Next, the operation when the power is turned on will be described in detail while comparing the operation with the operation of the conventional LDO shown in FIG. 6 not having the capacitor Css.

Figure 3A:
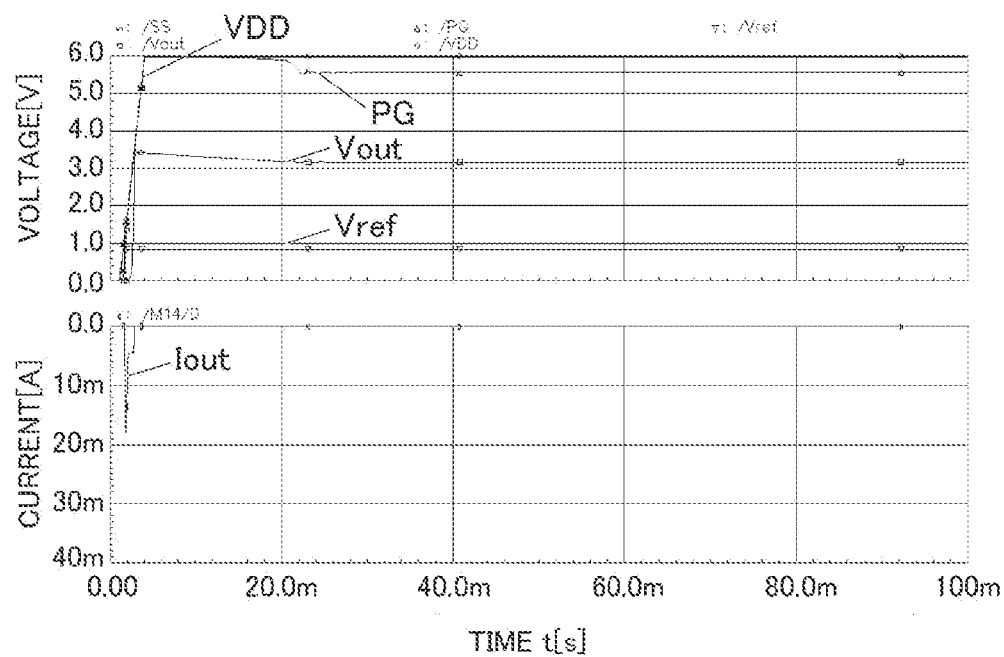
FIG. 3A is a waveform diagram showing the change in the voltage and the output current of each section at the time of power-on in a conventional LDO shown in FIG. 6.
Figure 4A:
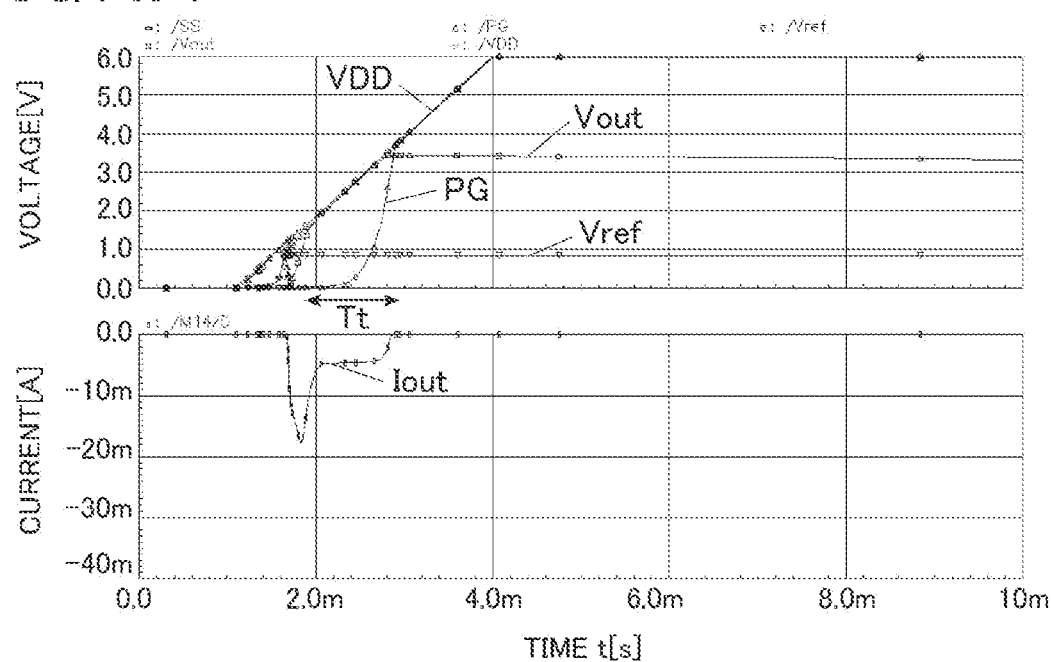
FIG. 4A is a waveform diagram showing the change in the voltage and the output current of each section at the time of power-on, enlarging the time axis of the waveform in FIG. 3A.
Figure 4B:
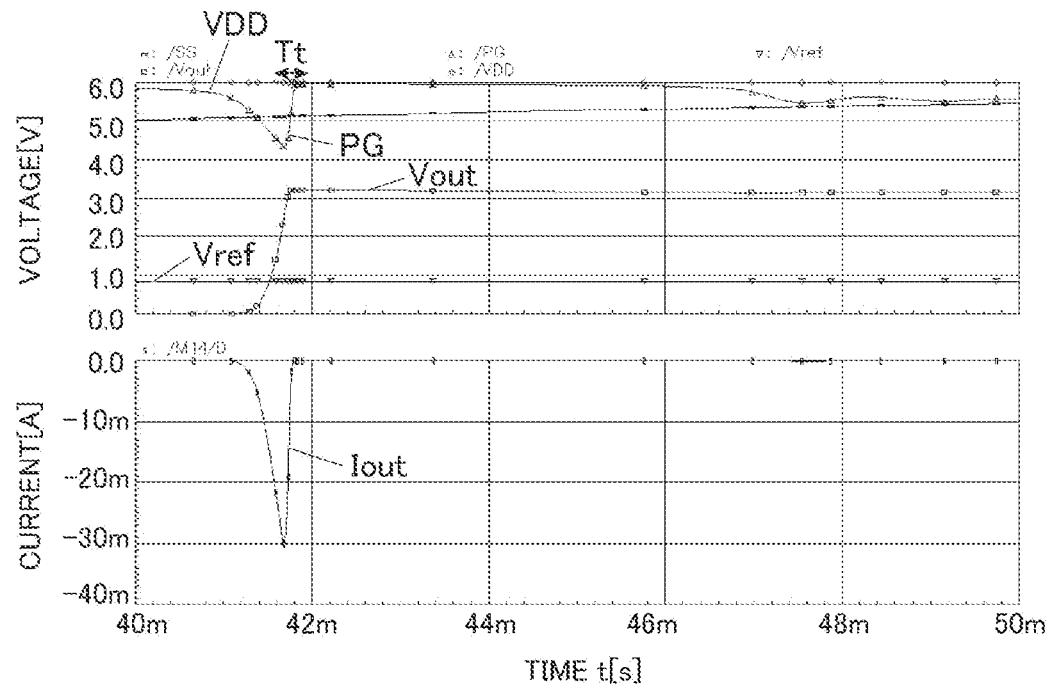
FIG. 4B is a waveform diagram showing the change in the voltage and the output current of each section at the time of power-on, enlarging the time axis of the waveform in FIG. 3B.

First, the reason the overshoot occurs in the output voltage when the power is turned on will be described in the conventional LDO shown in FIG. 6. FIG. 3A shows waveforms of the input voltage VDD of the voltage input terminal IN, the gate voltage PG of the output transistor M0, the output voltage Vout, the reference voltage Vref and the output current Iout at the time of turning on the power in the LDO shown in FIG. 6. FIG. 4A shows the waveforms of the above respective voltages and the current, enlarging the time axis of FIG. 3A.

Figure 6:
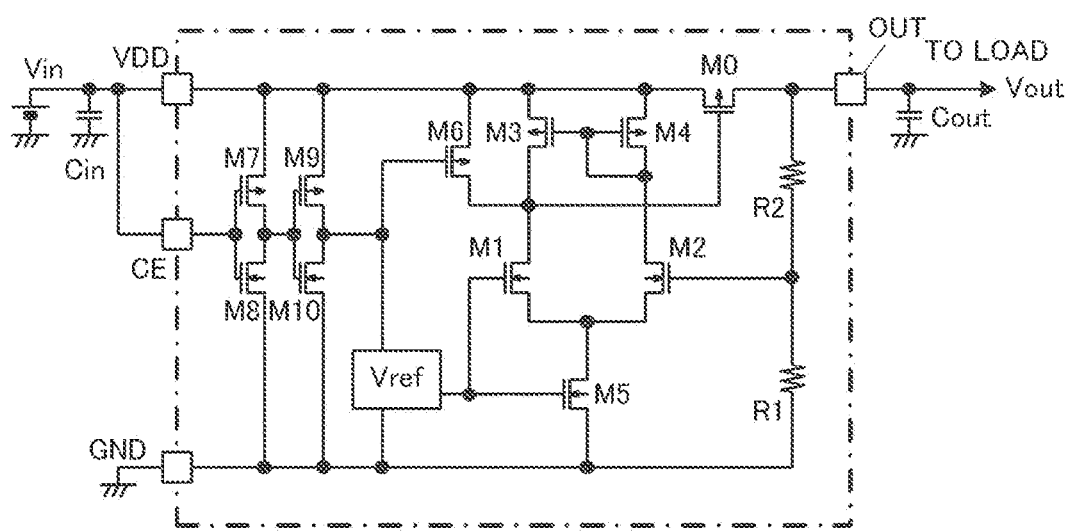
FIG. 6 is a circuit configuration view showing a configuration example of a conventional regulator IC that forms a low current consumption type LDO.

As shown in FIG. 3A, in the LDO shown in FIG. 6, when the input voltage VDD rises in several milliseconds, the output voltage Vout rises similarly to VDD. At this time, the output transistor M0 makes flow of the output current (so called rush current) Iout in the non-saturation region, and raises the output voltage Vout while charging the output capacitor Cout. In this case, as in FIG. 3A, the gate voltage PG of the output transistor M0 is nearly 0V and fully drives, and charging is performed at the maximum electric current. When the feedback voltage becomes equal to the reference voltage Vref, the error amplifier 11 turns off the output transistor M0, and interrupts the output current Iout.

At this time, regardless of the parasitic capacity (such as the gate capacity) of the output transistor M0 being large, the regulator IC of the LDO which was designed as the low current consumption type has a small electric current of the transistor M5 as the current source of the error amplifier 11. Thus, as shown in FIG. 4A, the gate voltage PG has a relatively long transition time Tt. As a result, the output current Iout is supplied to the output capacitor Cout during the transition time Tt and the output voltage Vout rises to overshoot.

Figure 3B:
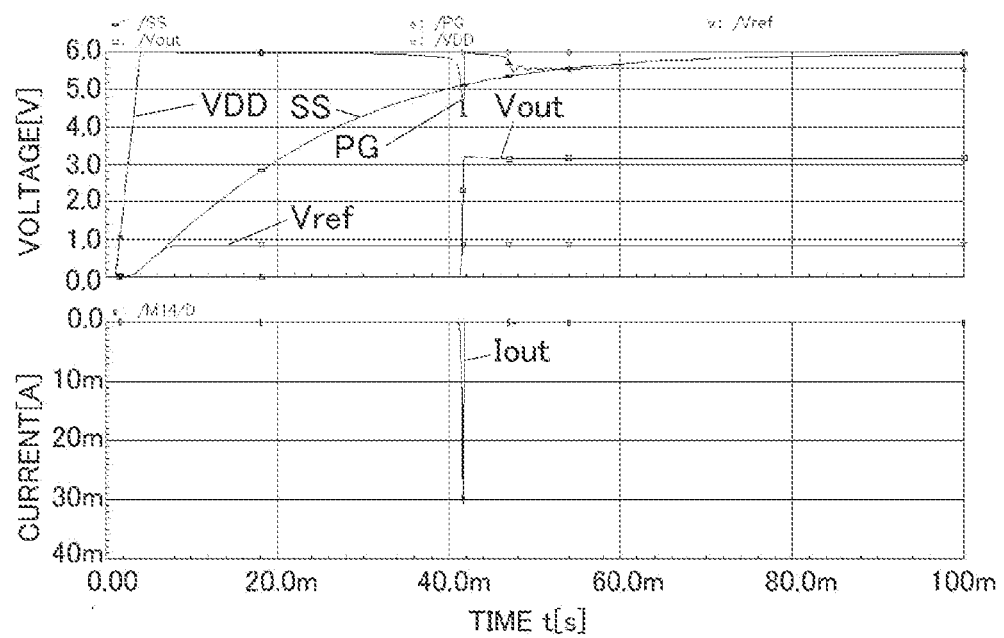
FIG. 3B is a waveform diagram showing the change in the voltage and the output current of each section at the time of power-on in an LDO shown in the embodiment of FIG. 2.

On the other hand, in the LDO of the above embodiment shown in FIG. 2, when the input voltage VDD rises and the voltage exceeds approximately 1V which is a threshold voltage of the inverter 13a, the transistor M8 of the inverter 13a and the transistor M9 of the inverter 13b are turned on. Then, the voltage Vss of the external terminal SS gradually rises as shown in FIG. 3B by the time constant of each of the on-resistance of M9 and the external capacitor Css. When the voltage Vss reaches "VDD-1V", the transistor M6 is turned off and the error amplifier 11 starts up. That is, a delay occurs until the error amplifier 11 starts up.

At this time, the output transistor M0 operates in the saturation region. Thus, since the output transistor M0 has a high current capability, the error amplifier 11 suppresses the drive voltage of the gate terminal of the output transistor M0, and charges the output capacitor Cout. As a result, the feedback voltage VFB becomes equal to the reference voltage Vref to shorten the transition time Tt of the gate voltage PG when the output transistor M0 is turned off, and the overshoot of the output voltage Vout is reduced.

The shutdown transistor M6 is gradually turned off and slowly activates the error amplifier 11 by the voltage of the external terminal SS slowly rising as shown in FIG. 3B. By such a soft start of the error amplifier 11, it is possible to suppress the reduction of the gate voltage PG when the output transistor M0 is turned off.

Furthermore, since the transistor M9 of the inverter 13b is the P-channel MOS transistor, the transistor M9 has an opposite direction parasitic diode Ds as shown by the dotted line in FIG. 2. When the input voltage VDD falls down, the transistor M9 promptly discharges the external capacitor Css of the external terminal SS via the parasitic diode Ds. Thus, when the input voltage VDD rises again, it is possible to cause the soft start again.

As mentioned above, since the LDO using the regulator IC in the embodiment can form the soft start circuit by only the external capacitor Css without adding any circuit, it is possible to take the overshoot measure of the output voltage by a single capacitor, which enables saving the space and lowering the cost. In addition, it is possible to take the overshoot measure without increasing the current consumption. Furthermore, by setting the capacity value of the external capacitor Css as needed, it is possible to adjust the delay time according to the power supply rising time. By using the parasitic diode of the transistor M9, it is possible to promptly discharge the external capacitor Css of the external terminal SS when the input voltage VDD is turned off.

Modification Example

Next, a modification example of the regulator IC in the embodiment will be described by using FIG. 5.

Figure 5:
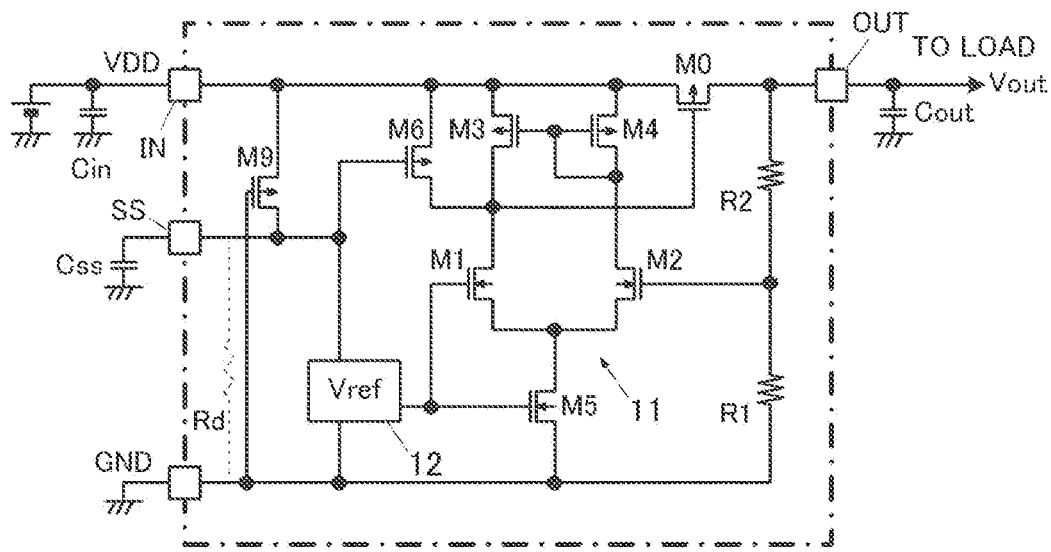
FIG. 5 is a circuit configuration view showing a modification example of the regulator IC in the embodiment of FIG. 2.

The regulator IC in the modification example shown in FIG. 5 includes only the P-channel MOS transistor corresponding to the transistor M9 of the inverter 13b instead of the inverters 13a, 13b, and the gate terminal of the P-channel MOS transistor is connected to the ground point.

The transistor M9 in the modification example has similar functions to those of the inverters 13a, 13b of the embodiment. M9 and the external capacitor Css of the external terminal SS can form the soft start circuit of the error amplifier 11. The modification example can be applied to the regulator IC not having the external terminal CE for on/off control. It is possible to reduce the number of elements and simplify the configuration.

It is also possible to have a configuration that can turn on the shutdown transistor M6 and forcibly turn off the output transistor M0 by providing an external transistor in parallel with the capacitor Css of the external terminal SS and turning on the transistor with a control signal to apply the ground potential to the external terminal SS. As shown by the dotted line in FIG. 5, a resistance element Rd may be connected between the external terminal SS and the ground point, to assist discharging when the input voltage VDD falls down. The resistance element Rd for assisting the discharging may be connected as an external element.

Though the invention made by the present inventors has been specifically described on the basis of examples, the present invention is not limited to the examples. For example, in the examples, the MOS transistor (MOSFET) is used as the transistor forming the inverters 13a, 13b and the error amplifier 11 and the output transistor M0. However, the bipolar transistor may be used instead of the MOS transistor.

In the examples, the resistors R1 and R2 for dividing the output voltage Vout are provided inside the chip. However, it is possible to provide a voltage dividing circuit formed of an external resistor and input the voltage divided outside the chip from an external terminal to the error amplifier 11. It is also possible to connect only the resistor R2 among the resistors R1 and R2 as the external resistor.

According to the embodiment, it is possible to suppress the overshoot of the output voltage at the time of turning on the power in the semiconductor integrated circuit (regulator IC) forming the DC power supply device such as a series regulator. Furthermore, it is possible to realize the regulator IC that can suppress the overshoot at the time of turning on the power, without largely increasing the cost.

Although the embodiment of the present invention has been described and illustrated in detail, the disclosed embodiment is made for purposes of not limitation but illustration and example only. The scope of the present invention should be interpreted by terms of the appended claims.

What is claimed is:

1. A semiconductor integrated circuit for a regulator for forming a low current consumption type DC power supply device, the semiconductor integrated circuit comprising:
   an output transistor that is connected between an output terminal and a voltage input terminal to which a DC voltage is input;
   a control circuit that controls the output transistor according to a feedback voltage of an output;
   an operation control transistor that controls an operation state of the control circuit;
   an external terminal to connect an external capacitor; and
   an RC time constant circuit that includes an on-resistance of a transistor and the capacitor connected to the external terminal, wherein the semiconductor integrated circuit includes a soft start circuit that operates the operation control transistor and activates the control circuit at a timing that is delayed, by the RC time constant circuit, from a timing of applying a power supply voltage to the voltage input terminal.

2. The semiconductor integrated circuit according to claim 1, wherein:

the control circuit comprises a differential amplifying circuit which includes a pair of differential input transistors, a pair of active load transistors, and a current source that makes an operation current flow to the pair of differential input transistors, and in which the feedback voltage is input to a control terminal of one differential input transistor among the differential input transistors and a reference voltage is input to a control terminal of the other differential input transistor among the differential input transistors, and the operation control transistor is connected between the voltage input terminal and one connection node among connection nodes between the pair of differential input transistors and the pair of active load transistors of the control circuit.

3. The semiconductor integrated circuit according to claim 1, wherein the soft start circuit includes a first inverter to which a voltage of an external terminal to input an on/off signal is input and a second inverter to which an output of the first inverter is input, and the on-resistance is an on-resistance of a transistor forming the second inverter.

4. The semiconductor integrated circuit according to claim 1, wherein the soft start circuit includes a first inverter to which a voltage of the voltage input terminal is input and a second inverter to which an output of the first inverter is input, and the on-resistance is an on-resistance of a transistor forming the second inverter.

5. The semiconductor integrated circuit according to claim 1, wherein the soft start circuit includes a P-channel MOS transistor that is connected between the voltage input terminal and the external terminal and that has a gate terminal connected to a ground point, and the on-resistance is an on-resistance of the P-channel MOS transistor.

* * * * *